United States Patent
Nakamura

(10) Patent No.: US 7,321,251 B2
(45) Date of Patent: Jan. 22, 2008

(54) BIAS CIRCUIT AND METHOD OF PRODUCING SEMICONDUCTOR DEVICE

(75) Inventor: Mitsuhiro Nakamura, Kanagawa (JP)

(73) Assignee: Sony Corporation (JP)

( * ) Notice: Subject to any disclaimer, the term of this patent is extended or adjusted under 35 U.S.C. 154(b) by 78 days.

(21) Appl. No.: 10/878,010

(22) Filed: Jun. 29, 2004

(65) Prior Publication Data

US 2005/0024123 A1 Feb. 3, 2005

(30) Foreign Application Priority Data

Jul. 16, 2003 (JP) .............................. P2003-275310

(51) Int. Cl.
*H03L 5/00* (2006.01)

(52) U.S. Cl. .................... 327/307; 327/430; 330/296

(58) Field of Classification Search ................ 327/307, 327/308, 430, 431, 435, 560; 330/296
See application file for complete search history.

(56) References Cited

U.S. PATENT DOCUMENTS

| | | | | |
|---|---|---|---|---|
| 3,644,923 A | * | 2/1972 | Foerster | 341/156 |
| 4,207,538 A | * | 6/1980 | Goel | 330/277 |
| 4,749,877 A | * | 6/1988 | Asazawa et al. | 327/541 |
| 4,990,973 A | * | 2/1991 | Ishikawa et al. | 257/142 |
| 5,361,007 A | * | 11/1994 | Ohta | 327/427 |
| 5,914,641 A | * | 6/1999 | Yun et al. | 330/302 |
| 6,163,221 A | * | 12/2000 | Matsuno | 330/302 |
| 6,329,879 B1 | * | 12/2001 | Maruyama et al. | 330/289 |
| 2001/0001545 A1 | * | 5/2001 | Kono et al. | 327/541 |
| 2002/0175664 A1 | * | 11/2002 | Andoh et al. | 323/315 |

FOREIGN PATENT DOCUMENTS

JP 09-283710 10/1997

* cited by examiner

*Primary Examiner*—Kenneth B. Wells
*Assistant Examiner*—Thomas J. Hiltunen
(74) *Attorney, Agent, or Firm*—Rader Fishman & Grauer PLLC; Ronald P. Kananen

(57) ABSTRACT

A bias circuit able to keep a bias current constant even if a threshold voltage of a transistor changes, provided with a resistance element connected between a bias voltage supply line and a gate and changing in resistance value linked with the threshold value of the transistor. Even if the threshold value of the transistor changes, the resistance value changes in response to the change of the threshold value. When the threshold voltage increases, the resistance value decreases and the bias voltage is adjusted by resistance division to increase. When the threshold voltage decreases, the resistance value increases and the bias voltage is adjusted by resistance division to decrease. The transistor is a junction type transistor having a first conductivity type channel and a second conductivity type gate. The resistance element is formed in the second conductivity type semiconductor region.

9 Claims, 8 Drawing Sheets

BIAS CIRCUIT AND METHOD OF PRODUCING SEMICONDUCTOR DEVICE

BACKGROUND OF THE INVENTION

1. Field of the Invention

The present invention relates to a bias circuit mounted in a power amplifier module used for a transmitter of a wireless system for example, and a method of producing a semiconductor device for the bias circuit.

2. Description of the Related Art

In a power amplifier module of a wireless transmitter, in particular, a power amplifier module used for a transmitter for a mobile phone, the bias current of the field effect transistor (FET) serving as the amplification element is set to a predetermined value. This is an important factor in determining the efficiency of power addition, distortion characteristic, or other aspects of the performance of the power amplifier module.

To determine the operating voltage and operating current of an FET, a bias circuit is connected to the gate. The bias circuit divides the voltage supplied from a gate bias supply terminal by resistance and supplies it to the gate. When the threshold voltage of the FET varies, however, there is the disadvantage that the operating current will not become constant if dividing the voltage by a constant resistance.

Further, one practice is to adjust the bias to the gate after completing the FET, but trimming of the resistance becomes necessary for each transistor, so there are the disadvantages that the trimming time increases and the area of the bias circuit becomes large.

Japanese Unexamined Patent Publication (Kokai) No. 9-283710 discloses a bias circuit for overcoming the above disadvantages. It uses an element of the same structure as the channel of the FET as the resistance. If possible to fabricate a resistance linked with the threshold voltage in a semiconductor substrate in this way, it would be possible to reduce the size of the bias adjustment circuit and drastically reduce the time and labor of a bias adjustment.

Summarizing the problems to be solved by the invention, if the threshold voltage becomes positive, a sheet resistance of the channel becomes one of an order of M$\Omega$ to G$\Omega$. Such a resistance cannot be used for a bias circuit. This is because when the voltage supplied to the gate electrode is 0V, the channel of an enhancement mode transistor is basically designed not to pass current.

In particular, there has been a strong demand for fabrication of an enhancement mode transistor, which makes the threshold voltage positive and reduces the off current when the gate voltage is 0V for the transistor used for a power amplifier for the purpose of reducing the power consumption.

Therefore, a bias circuit has been sought that is able to be used even when the threshold voltage is positive and is able to make the bias current constant without trimming.

SUMMARY OF THE INVENTION

An object of the present invention is to provide a bias circuit able to keep a bias current constant even if a threshold voltage of a transistor varies.

Another object of the present invention is to provide a method of producing a semiconductor device with the ability to produce a bias circuit, with the ability to keep a bias current constant even if a threshold voltage of a transistor varies, on the same substrate as that of the transistor.

To achieve the above object, according to a first aspect of the present invention, a bias circuit is provided having a transistor formed in a substrate and having a gate, source, and drain, and a bias adjustment circuit having a resistance-dividing circuit for dividing a voltage supplied from a bias voltage supply line to produce a voltage applied between the gate of the transistor and a references potential node, the bias adjustment circuit having a first resistance element connected between the bias voltage supply line and the gate of the transistor, and a second resistance element connected between the gate of the transistor and the reference potential node, and the first resistance element being formed in the same substrate and having a resistance value varying in response to the change of a threshold voltage of the transistor.

The bias circuit of the present invention has a resistance element with a resistance value linked with the threshold value of a transistor between a voltage supply line and a gate. Even when the threshold value of the transistor varies, the resistance value changes in response to the change of the threshold value. That is, when the threshold value increases, the resistance value decreases and the bias voltage is adjusted by the resistance division so as to increase. When the threshold values decreases, the resistance value increases and the bias voltage is adjusted by the resistance division so as to decrease.

According to a second aspect of the invention, a method is provided of producing a semiconductor device forming a resistance element for resistance-dividing a voltage supplied from a bias voltage supply line and for setting a bias voltage, and a junction type transistor having a gate supplied with the bias voltage, in a same semiconductor substrate, comprising the steps of, forming a first conductive type channel layer in the semiconductor substrate, and injecting a second conductive type impurity into an upper layer of the channel layer to form a gate region of the junction type transistor and a resistance region of the resistance element.

In the method of producing a semiconductor device of the present invention, a second conductivity type impurity is injected into an upper layer of the channel layer of the junction type-transistor to form a gate region and simultaneously the second conductivity impurity is injected into the layer in the resistance element region to form a resistance region. The resistance region formed in this way has the same depth as the gate region of the junction type transistor. The depth of the resistance region influences the resistance value of the resistance element and the threshold value of the transistor, so a resistance element with a resistance value linked with the threshold value of the transistor is produced on the same substrate.

The bias circuit of the present invention has the advantage that the bias current can be kept constant even if the threshold voltage of the transistor varies. Therefore, since the bias circuit is produced on the same substrate as the transistor, a small size bias circuit can be realized.

Further, according to the method of producing a semiconductor device of the present invention, a bias circuit able to keep the bias current constant, even if the threshold voltage of the transistor varies, can be produced on the same substrate as the transistor.

BRIEF DESCRIPTION OF THE DRAWINGS

These and other objects and features of the present invention will be described in more detail with reference to the accompanying drawings, in which.

DESCRIPTION OF THE PREFERRED EMBODIMENTS

Below, a bias circuit and a method of producing a semiconductor device will be explained with reference to the drawings.

Figure 1:
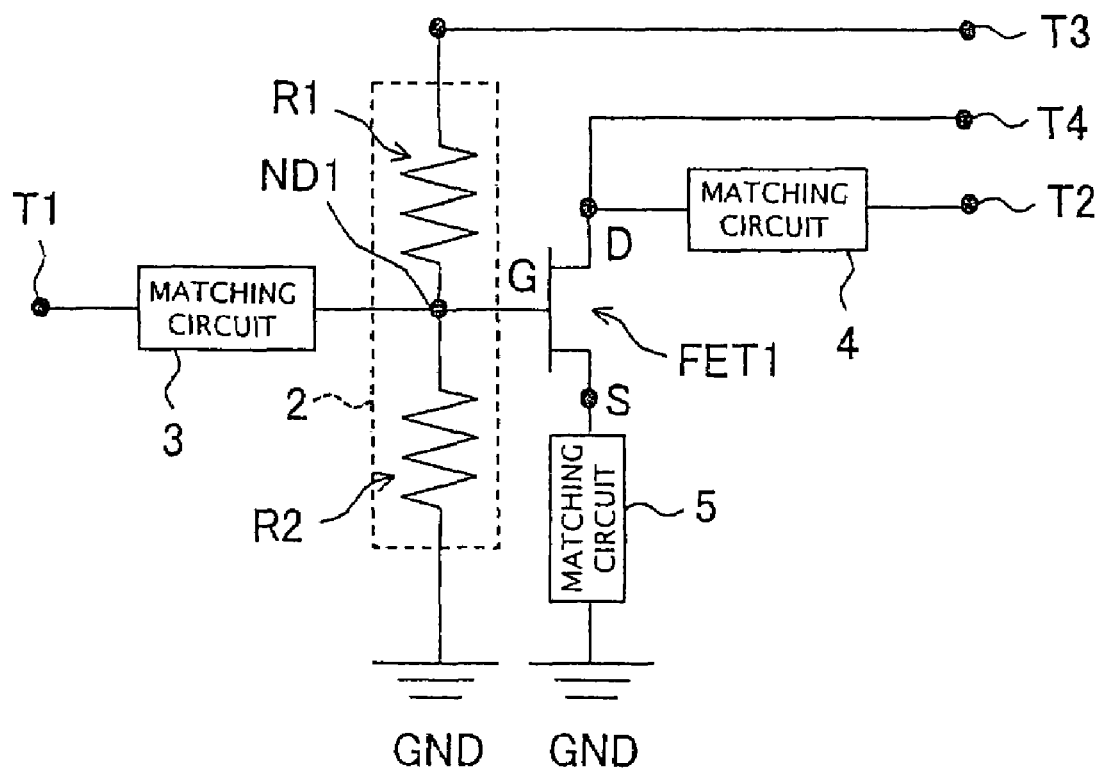
FIG. 1 is a view of an example of the configuration of a power amplifier module provided with a bias circuit according to an embodiment of the present invention.

FIG. 1 is a view of an example of a power amplifier module provided with a bias circuit according to the present embodiment.

The power amplifier module may have several FETs, but in the present embodiment, a single FET 1 is shown. The power amplifier module also has a bias circuit 2 connected to a gate terminal G of the FET 1 at a node ND1, a matching circuit 3 connected between the node ND1 of the bias circuit 2 and an input terminal T1, a matching circuit 4 connected between a drain terminal D of the FET 1 and an output terminal T2, and a matching circuit 5 connected between a source terminal S of the FET 1 and the grounding GND.

The bias circuit 2 is comprised of a resistance element R1 and a resistance element R2 connected in series between a gate bias supply terminal T3 and the ground GND. A node ND1 between the resistance element R1 and the resistance element R2 is connected to the gate terminal G of the FET 1. Usually, a trimming resistance is used for the resistance element R1 or the resistance element R2. In the present embodiment, however, no trimming resistance is used. Instead of this, the resistance element R1 is structured with a changing resistance value linked with a change of the threshold value of the FET 1. The drain terminal D of the FET is connected to a supply terminal T4 of the power supply. The line connecting the gate bias supply terminal T3 and the resistance element R1 corresponds to the voltage supply line of the present invention.

In the above power amplifier module, a high frequency signal is supplied to the gate terminal G of the FET 1 via the input terminal T1 and the matching circuit 3. The bias circuit 2 sets the gate bias voltage supplied to the gate terminal G based on the positive voltage supplied from the gate bias supply terminal T3. The FET 1 amplifies the gate bias voltage at an operation point to output a bias current containing the high frequency component to the matching circuit 4. The matching circuit 4 matches the impedance, and then outputs the amplified high frequency signal via the output terminal T2.

The bias circuit 2 according to the present embodiment has the function of supplying a bias voltage proportional to the threshold voltage of the FET 1 to the node ND1 even without trimming. More particularly, the resistance element R1 forming part of the bias circuit 2 is produced in the chip of the FET 1 by the same process as the production of the FET 1 and is structured having a resistance value corresponding to the threshold voltage of the FET 1. Note that the resistance element R2 is also preferably formed on the same substrate as the FET 1.

Figure 2:
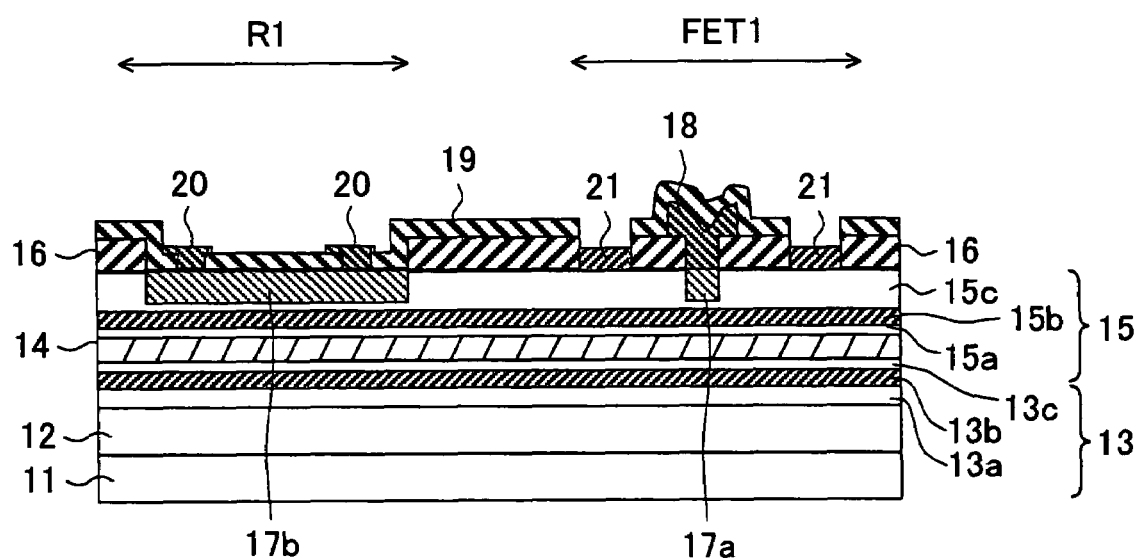
FIG. 2 is a cross-sectional view of an FET and a resistance element formed on the same chip.

FIG. 2 is a schematic cross-sectional view of the FET 1 and the resistance element R1 formed in the same chip. FIG. 2 shows the FET, as an example, configured by a pseudo-morphic high electron mobility transistor (PHEMT) permitting lattice mismatch in an epitaxial substrate to realize a high electron mobility and the resistance element fabricated using the epitaxial growth substrate of the PHEMT. The present embodiment will be explained with reference to an example of making the first conductivity type n-type and the second conductivity type p-type.

A semiinsulating single crystal GaAs substrate 11 is formed, via a buffer layer 12 of GaAs with no impurity added, with a barrier layer 13 of a Group III-V compound semiconductor.

The barrier layer 13 is comprised of a semiconductor of an AlGaAs mixed crystal containing Al in a content ratio of 0.2 to 0.3, and is structured by a high resistance region 13a not containing an impurity and having a thickness of about 200 nm, a carrier supply region 13b containing silicon as the n-type impurity in a high concentration of about 1 to $2 \times 10^{12}/cm^2$ and having a thickness of about 4 nm, and a high resistance region 13c not containing an impurity and having a thickness of about 2 nm successively stacked on the buffer layer 12 side. A channel layer 14 is formed on the barrier layer 13.

The channel layer 14 is comprised of a semiconductor having a band gap narrower than the semiconductor of the barrier layer 13, for example, a semiconductor of an InGaAs mixed crystal containing indium in a content ratio of 0.1 to 0.2, with no impurity added. Due to this, the channel layer 14 is supplied with carriers from the carrier supply region 13b of the barrier layer 13 and the later explained carrier supply region 15b of the high resistance barrier layer 15. The barrier layer 15 is formed on the channel layer 14.

The barrier layer 15, similar to the barrier layer 13, is comprised of a semiconductor of an AlGaAs mixed crystal containing Al in a content ratio of 0.2 to 0.3, and is structured by a high resistance region 15a not containing an impurity and having a thickness of about 2 nm, a carrier supply region 15b containing silicon as the n-type impurity in a high concentration of about 1 to $2 \times 10^{12}/cm^2$ and having a thickness of about 4 nm, and a high resistance region 15c not containing an impurity and having a thickness of about 70 to 200 nm successively stacked on the channel layer 14 side.

The high resistance region 15c is doped with Zn or another p-type impurity down to a location at least 10 nm from the channel layer 14 to form p-type impurity regions 17a and 17b. The p-type impurity region (gate region) 17a forms a gate of the junction type transistor FET 1, while the p-type impurity region (a resistance region) 17b forms the resistance element R1. As explained later, the p-type impurity regions 17a and 17b are formed by doping via apertures provided at predetermined locations of an insulating film 16 formed at the surface of the barrier layer 15 by vapor phase diffusion or ion implantation.

Silicon nitride insulating films 16 and 19, having a thickness of about 300 nm, are formed on the surface of the high resistance region 15c. Apertures exposing the surface of the p-type impurity region 17b are formed in the insulating films 16 and 19. Further, a pair of electrodes 20 connected, via the apertures, to the p-type impurity region 17b are provided on the insulating films 16 and 19. The electrodes 20 are preferably a metal able to form an ohmic contact with the p-type impurity region 17b and having a depth of reaction with the barrier layer 15 shallower than the p-type impurity region 17b. Therefore, the electrodes 20 are formed by, for example, titanium of a thickness of 50 nm, platinum of a thickness of 50 nm, and gold of a thickness of 200 nm stacked successively on the substrate side.

The insulating film 16 is formed with apertures exposing the p-type impurity region 17a, and a gate electrode 18 connected to the p-type impurity region 17a is formed in the aperture. The gate electrode 18 is formed by which titanium, platinum, and gold are stacked successively on the substrate side.

Two apertures, exposing the barrier layer 15 at suitable intervals, are provided in the insulating films 16 and 19. A pair of electrodes 21 serving as source or drain electrodes are formed with these apertures. The electrodes 21 are formed by gold-germanium, nickel, and gold successively stacked and alloyed and form ohmic contact with the barrier layer 15.

Although not shown, the resistance element R2 is formed on the same substrate as the junction type transistor FET 1 and the resistance element R1. The resistance element R2 can be formed by using the channel layer 14 or by a metal thin film.

Next, the method of producing the semiconductor device shown in FIG. 2 will be explained referring to FIGS. 3A to 3H.

Figure 3A:
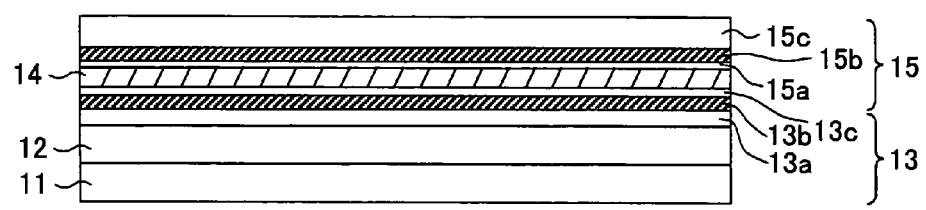
FIGS. 3A to 3H are cross-sectional views of steps of a method of producing a semiconductor device according to the present embodiment.

As shown in FIG. 3A, a substrate 11 comprised of GaAs has a GaAs layer not containing an impurity epitaxially grown on it to form a buffer layer 12. The buffer layer 12 has an AlGaAs layer not containing an impurity, an n-type AlGaAs layer containing silicon as an impurity, and an AlGaAs layer not containing an impurity successively epitaxially grown on it to form a barrier layer 13 comprised of a high resistance region 13a, a carrier supply region 13b, and a high resistance region 13c stacked together.

Next, the barrier layer 13 has InGaAs layer not containing an impurity epitaxially grown on it to form a channel layer 14. Further, the channel layer 14 has an AlGaAs layer not containing an impurity, an n-type AlGaAs layer containing silicon as an impurity, and an AlGaAs layer not containing an impurity successively epitaxially grown on it to form a barrier layer 15 comprised of a high resistance region 15a, a carrier supply region 15b, and a high resistance region 15c stacked together.

Figure 3B:
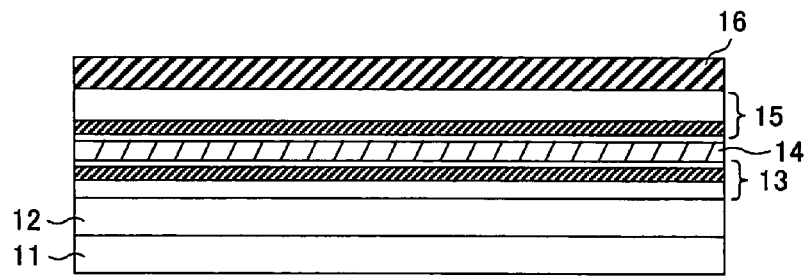

Next, as shown in FIG. 3B, silicon nitride is deposited by chemical vapor deposition (CVD) to form an insulating film 16.

Figure 3C:
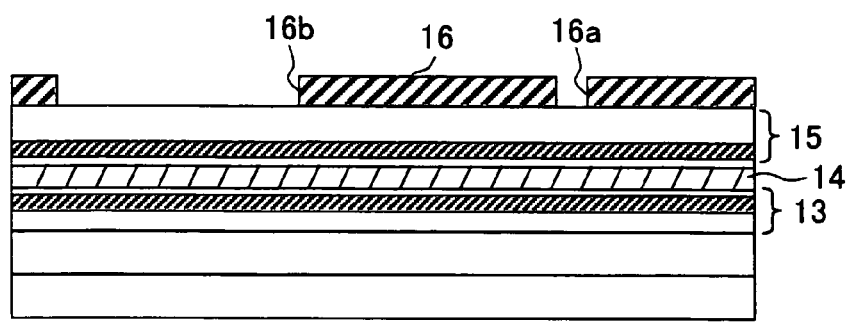

Next, as shown in FIG. 3C, patterns are formed by a resist and the parts of the insulating film 16 in the region for forming the resistance element and the region for forming the gate of the FET are removed by reactive ion etching (RIE). Next, the resist is removed. Therefore, the insulating film 16 is formed with apertures 16a and 16b.

Figure 3D:
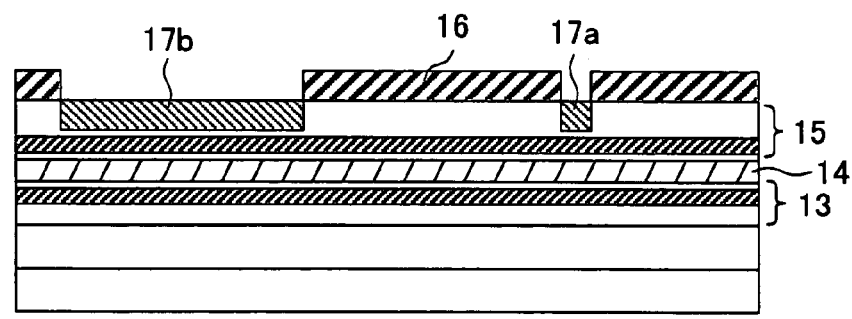

Next, as shown in FIG. 3D, for example, the substrate is heated to 600° C. and Zn forming a p-type impurity is vapor-diffused at the apertures 16a and 16b of the insulating film 16 to form p-type impurity regions 17a and 17b having constant depths at the barrier layer 15. The p-type impurity may be doped by ion implantation. However, in this case, since a high temperature thermal treatment has to be performed to activate the doped impurities, vapor phase diffusion is preferable. Here, in the case of vapor phase diffusion, the diffusion depth is controlled by time.

Figure 3E:
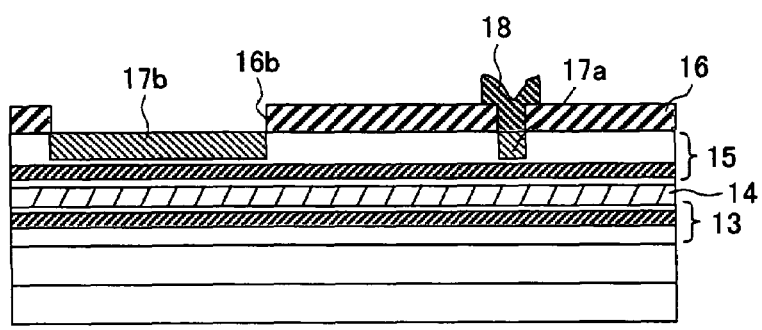

Next, as shown in FIG. 3E, a resist is formed which has an aperture at the aperture 16a, and a stacked film of Ti/Pt/Au serving as a gate metal is deposited and removed by a lift-off method at regions other than the gate electrode portion to form the gate electrode 18. Due to this, the gate electrode 18, connected to the p-type impurity region 17a, is formed with the aperture 16a of the insulating film 16. The gate electrode 18 corresponds to the gate terminal G shown in FIG. 1.

Figure 3F:
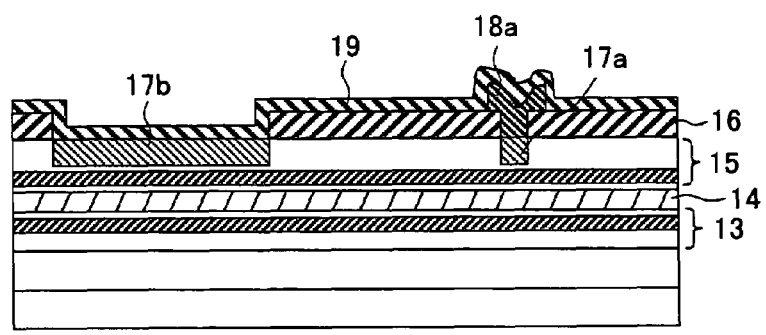

Next, as shown in FIG. 3F, for example, silicon nitride is deposited by CVD to form an insulating film 19 over the wafer.

Figure 3G:
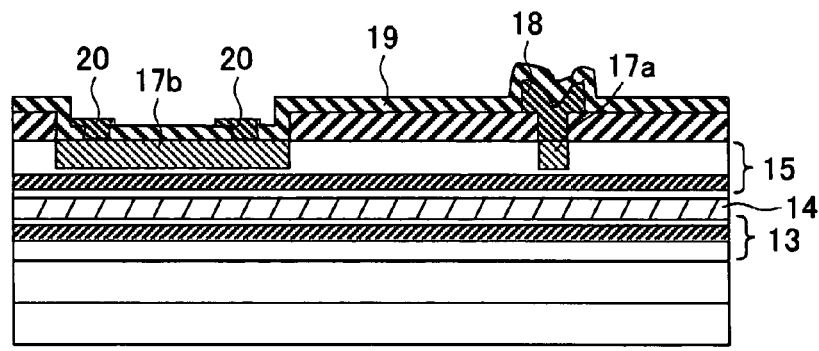

Then, as shown in FIG. 3G, apertures are formed by etching using a resist in the insulating film 19 in the electrode formation region of the resistance element. The entire surface of the insulating film including the apertures has Ti, Pt, and Au successively deposited over it. The resist and the unnecessary metal are removed by the lift off method, whereby a pair of electrodes 20 connected to the p-type impurity region 17b is formed.

Figure 3H:
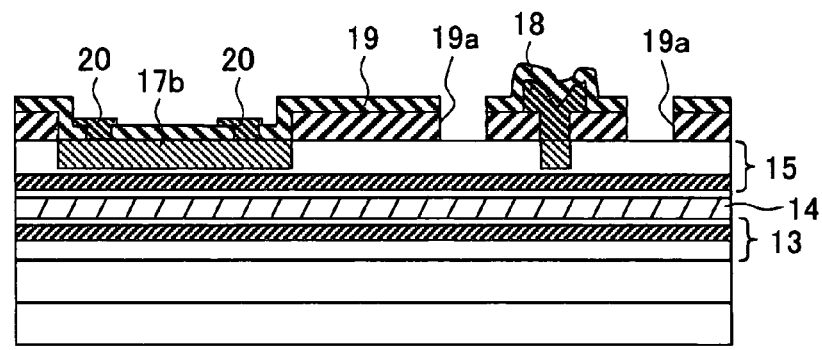

Next, as shown in FIG. 3H, a resist pattern having apertures is formed at two electrode portions for forming the source or drain, then the parts of the insulating films 16 and 19 in the two electrode portions are removed by etching. As a result, two apertures 19a, exposing the barrier layer 15, are formed in the insulating films 16 and 19.

In the following steps, AuGe alloy, Ni, and Au are successively formed by vapor deposition to form a metal layer over the entire surface while leaving the resist patterns as they are. The resist pattern and the parts of the metal layers in the unnecessary portions are removed by the lift-off method to leave the metal layer only at the electrode formation portions. For example, the metal layer is alloyed by thermal treatment of around 400° C. to form two electrodes 21 serving as the source and drain. Due to this, the semiconductor shown in FIG. 1 is produced.

The FET constituted by the above junction type PHEMT (JPHEMT) is formed with a p-type impurity region 17a differing from the conductivity type of the channel (n-type), whereby a built-in potential Φbi between the semiconductor of the channel layer 14 and the p-type impurity region 17a serving as the gate becomes large and a positive power supply operation can be performed. Further, in a JPHEMT having the above configuration, the smaller the distance between the p-type impurity region 17a and the channel layer 14, the larger the built-in potential Φbi between the semiconductor of the channel layer 14 and the p-type impurity region 17a, so the threshold voltage becomes larger in the positive direction. That is, the threshold voltage depends on not only the concentration or depth of the channel, but also the concentration or depth of the p-type impurity region 17a.

On the other hand, the p-type impurity region 17b formed simultaneously with the p-type impurity region 17a and constituting the resistance element is reduced in its resistance according to the diffusion depth of the p-type impurity region 17a.

Figure 4:
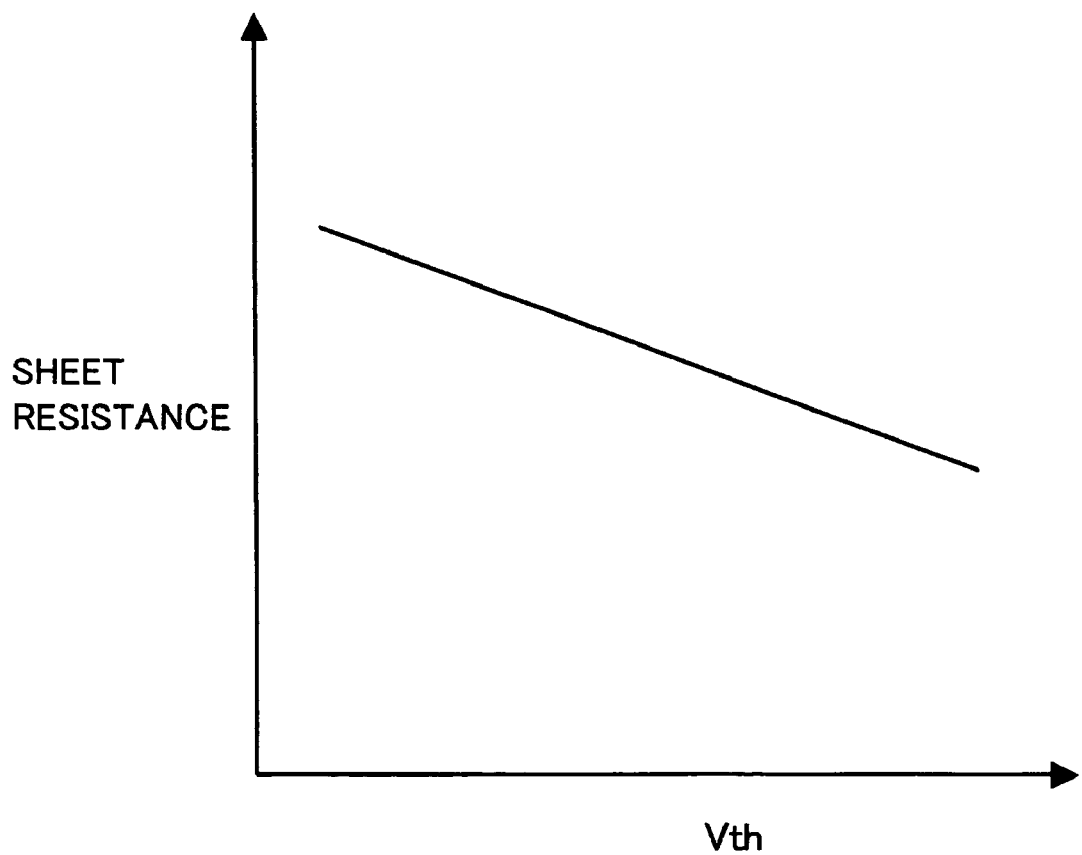
FIG. 4 is a graph showing a relation between the threshold value of the FET and a resistance value of the bias circuit.

Summarizing the above, the threshold voltage $V_{th}$ of the FET 1 based on the diffusion depth of the p-type impurity region and the resistance value of the resistance element R1 have the relation shown in FIG. 4. As shown in FIG. 4, when the threshold voltage of the FET increases due to variations in the diffusion of the p-type impurity region 17a, the sheet resistance of the resistance element R1 constituted by the p-type impurity region 17b falls. Therefore, the bias voltage at the node ND1 increases and the variation of the bias current is suppressed.

On the other hand, when the threshold voltage of the FET falls due to variation in diffusion of the p-type impurity region 17a, the sheet resistance of the resistance element R1 constituted by the p-type impurity region 17b increases. Therefore, the bias voltage at the node ND1 falls and the variation of the bias current is suppressed.

Figure 5:
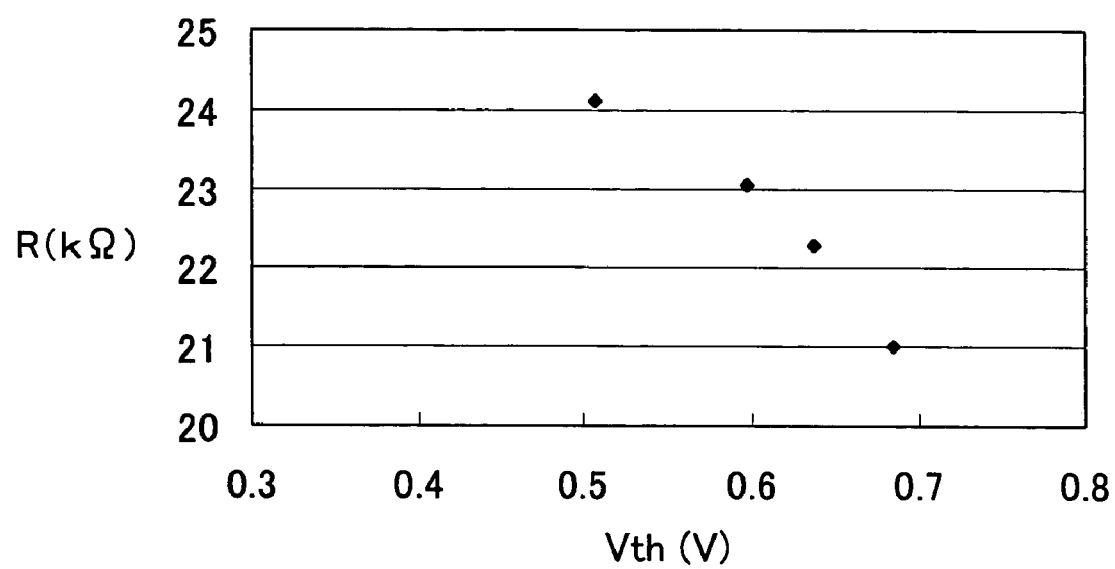
FIG. 5 is a graph showing variation of the actually measured resistance value of a bias circuit accompanying variation of the threshold value of an FET.

The threshold voltage of the FET and the resistance value of the resistance element R1 in the case of actually producing the above JPHEMT were measured, whereby the result shown in FIG. 5 was obtained. That is, as shown in FIG. 5, when the threshold voltage Vth of the FET increases, the resistance R of the resistance element R1 declines.

As explained above, the bias circuit according to the present embodiment is provided with a resistance element R1 matched with the threshold voltage of the FET 1 between the gate bias supply terminal T3 and the gate terminal G of the FET 1 on the same chip. Due to this, variation of the bias current due to variation in the threshold value of the FET 1 of different production lots can be suppressed.

As a result, a trimming resistance is unnecessary, and the above resistance element R1 can be formed in the step of producing the FET 1. Therefore, for example, a power amplifier module mounted with the bias circuit can be made smaller in size, and the production steps can be reduced.

In particular, the p-type impurity region 17b, forming the resistance element R1, is formed simultaneously with the diffusion step forming the p-type impurity region 17a, forming the gate of the junction-type FET, so the bias current can be kept constant even if the depth of diffusion in the diffusion step varies between wafers.

Note that while the present invention was explained with reference to an enhancement type FET supplied at its gate terminal with a positive voltage, it can be applied similarly to the case of supplying a negative voltage to the gate terminal. Therefore, a broad range of threshold values can be handled.

For example, the present invention can be applied to a JFET type transistor. In this case, the GaAs substrate is injected with silicon as the n-type (first conductivity type) channel. The n-type impurity is activated by annealing, and then an insulating film of a selected diffusion mask is deposited. The portion for forming the gate and the portion for forming the resistance linked with its threshold value are opened and diffused with the p-type (second conductivity type) impurity of Zn. As the threshold value becomes more positive, the resistance becomes smaller. Due to use of the resistance for the bias circuit of the transistor, the bias current can be kept constant even if the threshold voltage changes.

Further, the substrate 11 is not limited to GaAs and may also be an InP-based substrate. In this case, the channel layer 14 uses an InAs-based semiconductor, and the barrier layers 13 and 15 use a semiconductor having an energy band gap larger than the channel layer 14.

While the invention has been described with reference to specific embodiments chosen for purpose of illustration, it should be apparent that numerous modifications could be made thereto by those skilled in the art without departing from the basic concept and scope of the invention.

What is claimed is:

1. A bias circuit comprising:

a transistor formed in a substrate and having a gate, source, and drain; and a bias adjustment circuit having a resistance-dividing circuit for dividing a voltage supplied from a bias voltage supply line to produce a voltage applied between said gate of said transistor and a reference potential node, said bias adjustment circuit having a first resistance element connected directly between the bias voltage supply line and the gate of said transistor, and a second resistance element connected between said gate of the transistor and the reference potential node, wherein said first resistance element is diffused resistor having a resistance region comprising a doped semiconductor region, wherein said resistance region and the gate of said transistor are formed in the same substrate simultaneously in a single fabrication step and have an equal diffusion depth and impurity concentration, wherein variations in said fabrication step have an equal effect on the diffusion depth and impurity concentrations of said resistance region and the gate of said transistor, and wherein said bias circuit lowers the resistance of said first resistance element when the threshold voltage of said transistor is relatively high, and raises the resistance of said first resistance element when the threshold voltage of said transistor is relatively low.

2. A bias circuit as set forth in claim 1, wherein said transistor is a junction type transistor having a first conductive type channel and a second conductive type gate, and said first resistance element is formed in said second conductive type semiconductor region.

3. A bias circuit as set forth in claim 1, further including an input terminal in circuit with a first matching circuit connected to said gate of said transistor, an input signal applied to said input terminal.

4. A bias circuit as set forth in claim 1, further including gate bias supply terminal and said resistance element.

5. A bias circuit as set forth in claim 1, further including a supply terminal connected to a power supply and a drain terminal of said transistor, and a matching circuit connected to said drain and an output terminal for said bias circuit.

6. A bias circuit as set forth in claim 1, wherein said transistor is an FET and said first resistance element is formed in a same chip as said FET.

7. The bias circuit as set forth in claim 6 wherein said FET transistor includes a gate region having a same type impurity region as the resistance region forming said first resistance element.

8. The bias circuit as set forth in claim 1, wherein said bias adjustment circuit is structured to provide a bias voltage to said transistor that is proportional to the threshold voltage of the transistor at a node connected between said first and said second resistance elements and connected to said gate of said transistor.

9. A bias circuit comprising:

a transistor formed in a substrate and having a gate, source, and drain; and a bias adjustment circuit having a resistance-dividing circuit for dividing a voltage supplied from a bias voltage supply line to produce a voltage applied between said gate of said transistor and a reference potential node, said bias adjustment circuit having a first resistance element connected directly between the bias voltage supply line and the gate of said transistor, and a second resistance element connected between said gate of the transistor and the reference potential node, wherein said first resistance element has a resistance region comprising a doped semiconductor region, wherein said resistance region is formed in the same substrate and has the same diffusion depth and impurity concentration as said gate of said transistor, wherein an increase in said diffusion depth or impurity concentration will tend to decrease the resistance of said first resistance element and increase the threshold voltage of said transistor, wherein a decrease in said diffusion depth or impurity concentration will tend to increase the resistance of said first resistance element and decrease the threshold voltage of said transistor, and wherein said bias circuit is structured so that the voltage applied between the gate of said transistor and the reference potential node is dependent on the resistance value of the first resistance element and remains proportional to the threshold voltage of said transistor despite variations in said diffusion depth or impurity concentration.

* * * * *